(12) United States Patent
Chen (10) Patent No.: US 9,531,336 B2
(45) Date of Patent: Dec. 27, 2016

(54) OPERATIONAL AMPLIFIER AND DRIVING CIRCUIT

(71) Applicant: Novatek Microelectronics Corp., Hsinchu (TW)

(72) Inventor: Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 151 days.

(21) Appl. No.: 14/468,338

(22) Filed: Aug. 26, 2014

(65) Prior Publication Data

US 2015/0270811 A1 Sep. 24, 2015

(30) Foreign Application Priority Data

Mar. 19, 2014 (TW) .............................. 103110329 A (51) Int. Cl.
*H03F 3/45* (2006.01)
*H03F 3/30* (2006.01)

(52) U.S. Cl.
CPC ........ *H03F 3/45237* (2013.01); *H03F 3/3028* (2013.01); *H03F 3/45* (2013.01); *H03F 2200/411* (2013.01); *H03F 2203/30021* (2013.01); *H03F 2203/45054* (2013.01); *H03F 2203/45124* (2013.01); *H03F 2203/45646* (2013.01); *H03F 2203/45648* (2013.01)

(58) Field of Classification Search
CPC  H03F 3/45237; H03F 3/3028; H03F 3/45071; H03F 3/45183; H03F 3/45085; H03F 2203/45674; H03F 3/3066; H03F 3/3022; H03F 3/45192; H03F 3/3001; H03F 3/45475

USPC ................................................. 330/255, 257
See application file for complete search history.

(56) References Cited

U.S. PATENT DOCUMENTS 6,392,485 B1   5/2002  Doi et al.
7,535,302 B2*  5/2009  Nishimura ............ H03F 3/3022
                                                    330/255
7,583,146 B2   9/2009  Tam et al.
(Continued)

FOREIGN PATENT DOCUMENTS

TW        200807870        2/2008

OTHER PUBLICATIONS

"Notice of allowance of Taiwan Counterpart Application", issued on Nov. 19, 2015, p. 1-p. 5.

*Primary Examiner* — Khanh V Nguyen
(74) *Attorney, Agent, or Firm* — Jianq Chyun IP Office (57) ABSTRACT

An operational amplifier, including an input stage circuit, an output stage circuit and a constant-gm circuit is provided. The input stage circuit provides a driving voltage according to an input voltage. Input terminals of the output stage circuit receive the driving voltage, and an output terminal of the output stage circuit provides an output voltage according to the driving voltage. The constant-gm circuit includes a constant-gm switch circuit, a current mirror circuit and a current mirror switch circuit. The constant-gm switch circuit controls the operation of the constant-gm circuit. The constant-gm switch circuit allows the current mirror circuit to operate during a transient time when the driving voltage is transited according to the driving voltage, so as to provide a compensated current for the input stage circuit. When the driving voltage is during a non-transient time, the current mirror switch circuit turns off the current mirror circuit.

13 Claims, 4 Drawing Sheets

(56) References Cited

U.S. PATENT DOCUMENTS

| 8,451,060 | B2 | 5/2013 | Chen et al. | |
|---|---|---|---|---|
| 2012/0133632 | A1* | 5/2012 | Hsu | H03F 3/4521 330/253 |
| 2013/0088473 | A1* | 4/2013 | Tsuchi | H03F 3/3022 330/257 |

* cited by examiner

OPERATIONAL AMPLIFIER AND DRIVING CIRCUIT

CROSS-REFERENCE TO RELATED APPLICATION

This application claims the priority benefit of Taiwan application serial no. 103110329, filed on Mar. 19, 2014. The entirety of the above-mentioned patent application is hereby incorporated by reference herein and made a part of this specification.

BACKGROUND

Technical Field

The invention relates to an operational amplifier and a driving circuit, and particularly relates to an operational amplifier capable of improving a response speed and a driving circuit thereof.

Related Art

Operational amplifier plays an important role in design of an integrated circuit, and the operational amplifier can be used to implement a plurality of different operation functions. For example, the operational amplifier can be used to enhance driving capability of an output signal for driving a load or a next stage circuit.

Generally, the operational amplifier can be a negative feedback configuration and has unity gain. Under such configuration, an output voltage of the operational amplifier is varied along with variation of a received input voltage, and the output voltage ideally has a same voltage level with that of the input voltage. However, when the input voltage is transited (which refers to a situation that the input voltage is transited from a low voltage level to a high voltage level, or is transited from the high voltage level to the low voltage level), if the voltage level thereof is changed to be too high or too low, a part of transistors in the operational amplifier are turned off. In this case, a current amount of the operational amplifier is decreased, which causes reduction of a response speed of the operational amplifier and increase of a transition period of the operational amplifier. The transition period refers to a time period required for the output voltage of the operational amplifier that changes along with transition of the input voltage reaching a stable output.

In order to mitigate the above problem, the current operational amplifier applies a constant-gm circuit, and adopts a stable bias to control a current source, so as to implement a current compensation to an input stage circuit of the operational amplifier. However, when the operational amplifier is in a stable state (i.e. the operational amplifier stably outputs the output voltage), such structure may cause extra direct current (DC) power consumption.

SUMMARY

The invention is directed to an operational amplifier and a driving circuit thereof, by which a response speed of the operational amplifier is enhanced and extra direct current (DC) power consumption under a stable state is mitigated.

The invention provides an operational amplifier including an input stage circuit, an output stage circuit and a constant-gm circuit. The input stage circuit provides at least one driving voltage according to an input voltage. The output stage circuit is coupled to the input stage circuit, and has at least one input terminal and an output terminal. The input terminals receive the driving voltage, and the output terminal provides an output voltage according to the driving voltage, and the output terminal is coupled to an inverted input terminal of the input stage circuit. The constant-gm circuit includes a constant-gm switch circuit, at least one current mirror circuit and a current mirror switch circuit. The constant-gm switch circuit is coupled to the input stage circuit, and controls an operation of the constant-gm circuit. The current mirror circuit is coupled to the constant-gm switch circuit. The current mirror switch circuit is coupled between the constant-gm switch circuit and the current mirror circuit. The constant-gm switch circuit allows the current mirror circuit to operate during a transition period when the driving voltage is transited according to the driving voltage received by the output stage circuit, so as to provide a compensation current for the input stage circuit. When the driving voltage is in a non-transition period, the current mirror switch circuit turns off the current mirror circuit.

In an embodiment of the invention, the driving voltage is transited along with transition of the input voltage.

In an embodiment of the invention, the input terminals of the output stage circuit include a first input terminal and a second input terminal, and the input stage circuit includes a first transistor differential pair and a second transistor differential pair. The first transistor differential pair includes a first transistor and a second transistor. The first transistor has a first terminal, a second terminal and a control terminal. The first terminal of the first transistor is coupled to the first input terminal of the output stage circuit, and the control terminal of the first transistor receives the input voltage. The second transistor has a first terminal, a second terminal and a control terminal. The control terminal of the second transistor receives the output voltage. The second terminal of the first transistor and the second terminal of the second transistor are commonly coupled to a first common node, and a voltage level of the first common node is determined by a first bias. The second transistor differential pair includes a third transistor and a fourth transistor. The third transistor has a first terminal, a second terminal and a control terminal. The first terminal of the third transistor is coupled to the second input terminal of the output stage circuit, and the control terminal of the third transistor receives the input voltage. The fourth transistor has a first terminal, a second terminal and a control terminal. The control terminal of the fourth transistor receives the output voltage. The second terminal of the third transistor and the second terminal of the fourth transistor are commonly coupled to a second common node, and a voltage level of the second common node is determined by a second bias.

In an embodiment of the invention, when one of the first transistor differential pair and the second transistor differential pair is turned off in response to transition of the driving voltage, the constant-gm switch circuit provides the compensation current to another one of the first transistor differential pair and the second transistor differential pair during the transition period according to the driving voltage received by the output stage circuit.

In an embodiment of the invention, the output stage circuit includes a fifth transistor and a sixth transistor. The fifth transistor has a first terminal, a second terminal and a control terminal. The first terminal of the fifth transistor is coupled to a power voltage, the second terminal of the fifth transistor is coupled to the output terminal, and the control terminal of the fifth transistor serves as the first input terminal of the output stage circuit and receives the driving voltage. The sixth transistor has a first terminal, a second terminal and a control terminal. The first terminal of the sixth transistor is coupled to a ground voltage, the second terminal of the sixth transistor is coupled to the output terminal, and the control terminal of the sixth transistor serves as the second input terminal of the output stage circuit and receives the driving voltage.

In an embodiment of the invention, the input stage circuit includes a seventh transistor and an eighth transistor. The seventh transistor has a first terminal, a second terminal and a control terminal. The first terminal and the second terminal of the seventh transistor are coupled between the first common node and a ground voltage, and the control terminal of the seventh transistor receives the first bias. The eighth transistor has a first terminal, a second terminal and a control terminal. The first terminal and the second terminal of the eighth transistor are coupled between the second common node and a power voltage, and the control terminal of the eighth transistor receives the second bias.

In an embodiment of the invention, the current mirror circuit includes a first current mirror circuit and a second current mirror circuit, and the constant-gm switch circuit includes a first switch and a second switch. The first switch has a first terminal, a second terminal and a control terminal. The first terminal of the first switch is coupled to the second common node and the second current mirror circuit, and the control terminal of the first switch receives the second bias. The second switch has a first terminal, a second terminal and a control terminal. The first terminal of the second switch is coupled to the first common node and the first current mirror circuit, and the control terminal of the second switch receives the first bias.

In an embodiment of the invention, the current mirror switch circuit includes a third switch and a fourth switch. The third switch has a first terminal, a second terminal and a control terminal. The first terminal of the third switch is coupled to the second terminal of the first switch, the second terminal of the third switch is coupled to the first current mirror circuit, and the control terminal of the third switch is coupled to the first input terminal of the output stage circuit. The fourth switch has a first terminal, a second terminal and a control terminal. The first terminal of the fourth switch is coupled to the second terminal of the second switch, the second terminal of the fourth switch is coupled to the second current mirror circuit, and the control terminal of the fourth switch is coupled to the second input terminal of the output stage circuit.

In an embodiment of the invention, the current mirror switch circuit includes a fifth switch, a sixth switch, a seventh switch and an eighth switch. The first current mirror circuit includes a first reference transistor, and the second current mirror circuit includes a second reference transistor. The first reference transistor has a first terminal, a second terminal and a control terminal. The first terminal of the first reference transistor and the control terminal of the first reference transistor are connected through the fifth switch, and are commonly connected to the second terminal of the first switch, and the control terminal of the first reference transistor is coupled to the ground voltage through the sixth switch. The fifth switch is turned on or turned off according to a voltage level of the first input terminal of the output stage circuit, and the sixth switch is turned on or turned off according to a voltage level inverted to the voltage level of the first input terminal of the output stage circuit. The second reference transistor has a first terminal, a second terminal and a control terminal. The first terminal of the second reference transistor and the control terminal of the second reference transistor are connected through the seventh switch, and are commonly connected to the second terminal of the second switch, and the control terminal of the second reference transistor is coupled to the power voltage through the eighth switch. The seventh switch is turned on or turned off according to a voltage level of the second input terminal of the output stage circuit, and the eighth switch is turned on or turned off according to a voltage level inverted to the voltage level of the second input terminal of the output stage circuit.

In an embodiment of the invention, the input stage circuit further includes a third current mirror, a fourth current mirror and a fifth current mirror. The third current mirror is coupled between the first terminal of the first transistor and the first terminal of the second transistor in the first transistor differential pair and a power voltage. The fourth current mirror is coupled between the first terminal of the third transistor and the first terminal of the fourth transistor in the second transistor differential pair and a ground voltage. The first current mirror is coupled between the first terminal of the first transistor and the first terminal of the second transistor in the first transistor differential pair and the first terminal of the third transistor and the first terminal of the fourth transistor in the second transistor differential pair.

In an embodiment of the invention, the output stage circuit includes a compensation capacitor circuit coupled between the fifth current mirror and the output stage circuit for stabilizing the output voltage.

In an embodiment of the invention, the operational amplifier is a rail-to-rail operational amplifier, the first transistor differential pair is an N-type transistor differential pair, and the second transistor differential pair is a P-type transistor differential pair.

The invention provides a driving circuit of an operational amplifier, where the operational amplifier includes an input stage circuit and an output stage circuit, and the output stage circuit receives at least one driving voltage. The driving circuit includes a constant-gm switch circuit, at least one current mirror circuit and a current mirror switch circuit. The constant-gm switch circuit is coupled to the input stage circuit, and controls an operation of the driving circuit. The current mirror circuit is coupled to the constant-gm switch circuit. The current mirror switch circuit is coupled between the constant-gm switch circuit and the current mirror circuit. The constant-gm switch circuit allows the current mirror circuit to operate during a transition period when the driving voltage is transited according to the driving voltage received by the output stage circuit, so as to provide a compensation current for the input stage circuit. When the driving voltage is in a non-transition period, the current mirror switch circuit turns off the current mirror circuit.

According to the above descriptions, the operational amplifier and the driving circuit thereof provided by the invention can determine whether the operational amplifier has a transition according to the driving voltage provided by the input stage circuit, and dynamically provide the compensation current to the input stage circuit only during the transition period. In this way, the invention implements a transition current compensation mechanism, by which a response speed of the operational amplifier is effectively enhanced and extra direct current (DC) power consumption under a stable state is mitigated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated

DETAILED DESCRIPTION OF DISCLOSED EMBODIMENTS

In order to effectively enhance a response speed of an operational amplifier and mitigate extra direct current (DC) power consumption of the operational amplifier under a stable state, the operational amplifier and the driving circuit thereof provided by the invention can determine whether the operational amplifier has a transition according to a driving voltage provided by an input stage circuit, so as to dynamically provide a compensation current to the input stage circuit only during a transition period. Regarding description of a detailed operation method of the invention, a circuit structure of the operational amplifier and operations thereof are first introduced with reference of FIG. 1A to FIG. 1C, and then implementation of a transition current compensation mechanism of the operational amplifier and the driving circuit thereof are introduced with reference of FIG. 2 to FIG. 4.

Figure 1A:
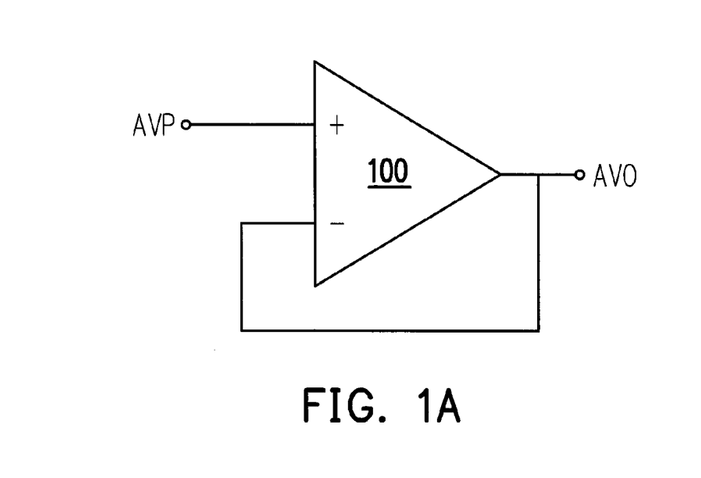
FIG. 1A is a block schematic diagram of an operational amplifier.

Referring to FIG. 1A, FIG. 1A is a block schematic diagram of an operational amplifier. The operational amplifier 100 includes a non-inverted input terminal, an inverted input terminal and an output terminal. The non-inverted input terminal receives an input voltage AVP input from external, and the inverted input terminal receives a feedback of an output voltage AVO. The operational amplifier 100 has unity gain due to the negative feedback configuration.

Figure 1B:
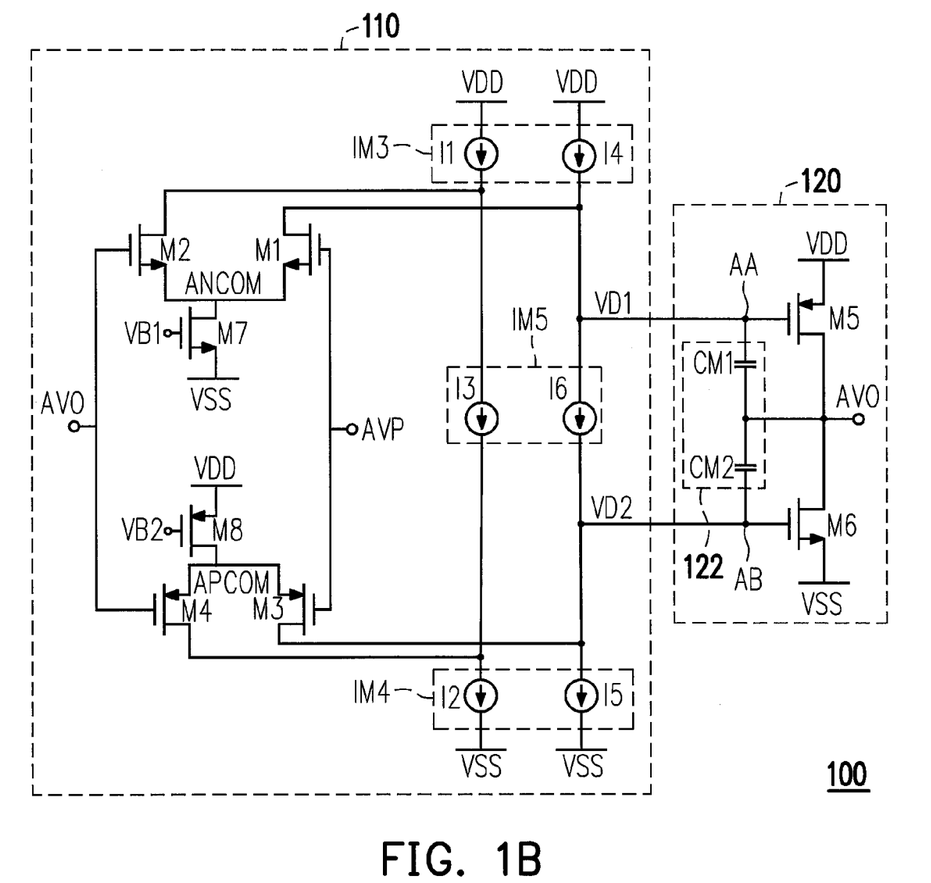
FIG. 1B is a detailed circuit schematic diagram of an operational amplifier according to an embodiment of the invention.

FIG. 1B is a detailed circuit schematic diagram of the operational amplifier 100 according to an embodiment of the invention. The operational amplifier 100 is, for example, a rail-to-rail operational amplifier, and includes an input stage circuit 110 and an output stage circuit 120. Corresponding to an input terminal and an output terminal of the operational amplifier 100 of FIG. 1A, the non-inverted input terminal of the input stage circuit 110 receives the input voltage AVP from external. The input stage circuit 110 provides driving voltages VD1 and VD2 according to the received input voltage AVP, and a first input terminal AA and a second input terminal AB of the output stage circuit 120 respectively receive the driving voltages VD1 and VD2. The output stage circuit 120 provides the output voltage AVO at the output terminal according to the driving voltages VD1 and VD2, and is coupled to the inverted input terminal of the input stage circuit 110 through the output terminal, so as to feed back the output voltage AVO to the input stage circuit 110.

The input stage circuit 110 may include a plurality of metal oxide semiconductor (MOS) transistors M1-M4, M7-M8 of different conductive types. A first transistor M1 and a second transistor M2 construct a first transistor differential pair, and are, for example, N-type MOS (NMOS) transistors. A drain of the first transistor M1 is coupled to the first input terminal AA of the output stage circuit 120, and a control terminal of the first transistor M1 receives the input voltage AVP. A control terminal of the second transistor M2 receives the output voltage AVO. A source of the first transistor M1 and a source of the second transistor M2 are commonly coupled to a first common node ANCOM, and a voltage level of the first common node ANCOM is determined by a first bias VB1.

A third transistor M3 and a fourth transistor M4 construct a second transistor differential pair, and are, for example, P-type MOS (PMOS) transistors. A drain of the third transistor M3 is coupled to the second input terminal AB of the output stage circuit 120, and a control terminal of the third transistor M3 receives the input voltage AVP. A control terminal of the fourth transistor M4 receives the output voltage AVO. A source of the third transistor M3 and a source of the fourth transistor M4 are commonly coupled to a second common node APCOM, and a voltage level of the second common node APCOM is determined by a second bias VB2.

A seventh transistor M7 is, for example, an NMOS transistor, and an eighth transistor M8 is, for example, a PMOS transistor. A source and a drain of the seventh transistor M7 are coupled between the first common node ANCOM and a ground voltage VSS, and a control terminal of the seventh transistor M7 receives the first bias VB1. A source and a drain of the eighth transistor M8 are coupled between the second common node APCOM and a power voltage VDD, and a control terminal of the eighth transistor M8 receives the second bias VB2. The seventh transistor M7 and the eighth transistor M8 respectively provide a driving current to the first transistor differential pair and the second transistor differential pair.

It should be noticed that the MOS transistor has a gate (corresponding to the aforementioned control terminal), a source and a drain, where the source and the drain have the same structure, and can be exchanged according to an actual operation situation. Therefore, the aforementioned "source" and "drain" are only used for distinguishing two connection electrodes of the device, and the "source" and the "drain" can be substantially exchanged for utilization.

Moreover, the input stage circuit 110 further includes current sources I1-I6. The first current source I1 and the fourth current source I4 construct a third current mirror IM3, and are coupled between the power voltage VDD and the drain of the first transistor M1 and the drain of the second transistor M2 in the first transistor differential pair. Similarly, the second current source I2 and the fifth current source I5 construct a fourth current mirror IM4, and are coupled between the ground voltage VSS and the drain of the third transistor M3 and the drain of the fourth transistor M4 in the second transistor differential pair. Moreover, the third current source I3 and the sixth current source I6 construct a fifth current mirror IM5, and are coupled between the drain of the first transistor M1, the drain of the second transistor M2 in the first transistor differential pair and the drain of the third transistor M3, the drain of the fourth transistor M4 in the second transistor differential pair. The first current source I1, the third current source I3 and the second current source I2 are connected in series to form a current path, and the fourth current source I4, the sixth current source I6 and the fifth current source I5 are connected in series to form another current path.

The output stage circuit 120 may include transistors M5 and M6 connected in series. The fifth transistor M5 is, for example, a PMOS transistor, and the sixth transistor M6 is, for example, an NMOS transistor. A source of the fifth transistor M5 is coupled to the power voltage VDD, a drain thereof is coupled to the output terminal, and a control terminal of the fifth transistor M5 serves as the first input terminal AA of the output stage circuit 120 and receives the driving voltage VD1. A source of the sixth transistor M6 is coupled to the ground voltage VSS, a drain thereof is coupled to the output terminal, and a control terminal of the sixth transistor M6 serves as the second input terminal AB of the output stage circuit 120 and receives the driving voltage VD2. The output stage circuit 120 further includes a compensation capacitor circuit 122 composed of two capacitors CM1 and CM2 connected in series, where the compensation capacitor 122 is coupled between the third current mirror IM3 and the fifth current mirror IM5 for stabilizing the output voltage AVO.

Based on the aforementioned circuit structure, in case that the input voltage AVP is changed from a low voltage level to a high voltage level, operations of various components of the operational amplifier 100 during a transition period are introduced below, and a transition current compensation mechanism implemented through the driving voltages VD1 and VD2 provided by the input stage circuit 110 is introduced below. It should be noticed that the high voltage level is, for example, a voltage level capable of turning on the first transistor M1 and the second transistor M2 of the first transistor differential pair. Namely, the input voltage AVP and the output voltage AVO at least have to reach a sum of a voltage difference between the control terminal and the source of the first transistor M1 or the second transistor M2 and a voltage difference between the drain and the source of the seventh transistor M7 in order to cope with the aforementioned high voltage level.

Based on the above premise, regarding the input stage circuit 110, when the input voltage AVP is changed from the low voltage level to the high voltage level, the first transistor M1 is turned on, and the third transistor M3 is turned off. Now, through the path that connects the ground voltage VSS through the turned on transistors M1 and the transistor M7 (which is turned on by suitably designing the first bias VB1), the input stage circuit 110 can discharge the driving voltage VD1 to the low voltage level and provide the same to the first input terminal AA of the output stage circuit 120. Then, the driving voltage VD1 of the low voltage level turns on the transistor M5, and through the path formed by the turned on transistor M5, the power voltage VDD charges the output voltage AVO of the output terminal to the high voltage level.

The output voltage AVO is output and fed back to the input stage circuit 110, and is received by the control terminals of the transistors M2 and M4. Now, the output voltage AVO of the high voltage level turns on the transistor M2 and turns off the transistor M4. In other words, when the input voltage AVP is changed from the low voltage level to the high voltage level, the second transistor of the input stage circuit 110 is turned off due to the transition, and a current amount of the operational amplifier 100 is decreased, which leads to decrease of the response speed.

Figure 1C:
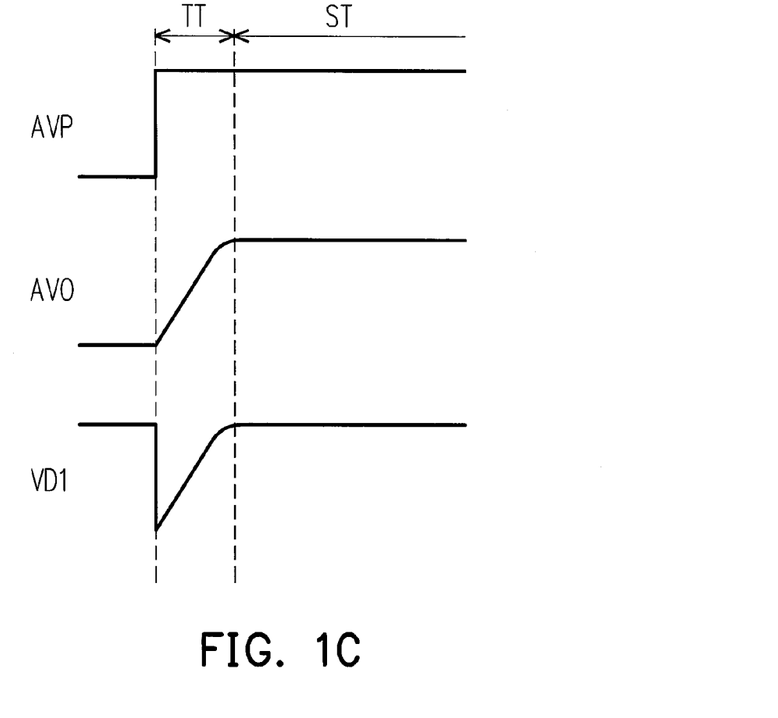
FIG. 1C is a voltage waveform diagram according to an embodiment of the invention.

On the other hand, according to the aforementioned circuit operation status, and with reference of a voltage waveform diagram of FIG. 1C, it is known that when the input voltage AVP is changed from the low voltage level to the high voltage level, during a transition period TT of the operational amplifier 100, the voltage level of the driving voltage VD1 is accordingly changed. When the operational amplifier 100 in a non-transition state (i.e. a stable state period ST), the driving voltage VD1 has a stable voltage level. Similarly, when the input voltage AVP is changed from the high voltage level to the low voltage level, the driving voltage VD2 only changes during the stable state period ST. Therefore, according to such characteristic, it is determined whether the operational amplifier is in the transition period according to voltage level variations of the driving voltage VD1 and VD2, and a driving circuit is used to perform current compensation to the first transistor differential pair and the second transistor differential pair during the transition period, so as to enhance the response speed of the operational amplifier. The aforementioned driving circuit can be implemented based on the circuit structure of the constant-gm circuit, which is described in detail below.

Figure 2:
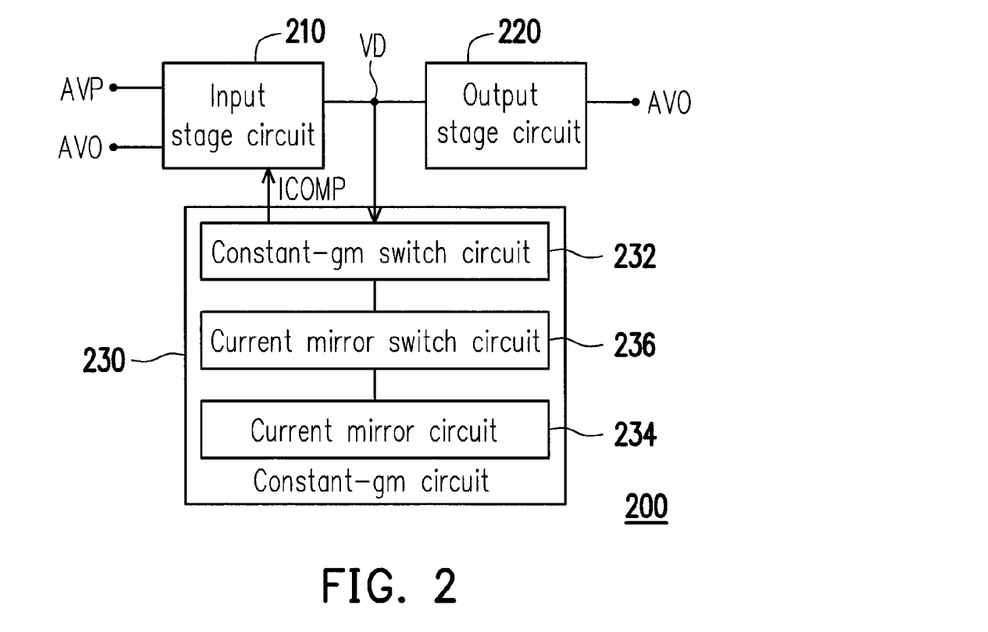
FIG. 2 is a block schematic diagram of an operational amplifier according to an embodiment of the invention.

The operational amplifier and the driving circuit thereof provided by the invention are first introduced. Referring to FIG. 2, FIG. 2 is a block schematic diagram of an operational amplifier according to an embodiment of the invention. The operational amplifier 200 includes an input stage circuit 210, an output stage circuit 220 and a constant-gm circuit 230. The input stage circuit 210 provides at least one driving voltage (for example, the driving voltages VD1 and VD2, which are denoted by VD in FIG. 2) according to the input voltage AVP. The output stage circuit 220 is coupled to the input stage circuit 210, and has at least one input terminal and an output terminal. The input terminals of the output stage circuit 220 receive the driving voltage VD, and the output terminal provides the output voltage AVO according to the driving voltage VD, and the output terminal is coupled to an inverted input terminal of the input stage circuit 220. Detailed circuit structures of the input stage circuit 210 and the output stage circuit 220 of the present embodiment are similar as that described in the aforementioned embodiment, such that components therein and operation methods thereof may refer to the aforementioned descriptions.

The constant-gm circuit 230 serves as the driving circuit of the operational amplifier 200, and includes a constant-gm switch circuit 232, at least one current mirror circuit 234 and a current mirror switch circuit 236. The constant-gm switch circuit 232 is coupled to the input stage circuit 210, and controls an operation of the constant-gm circuit 230. The current mirror circuit 234 is coupled to the constant-gm switch circuit 232. The current mirror switch circuit 236 is coupled between the constant-gm switch circuit 232 and the current mirror circuit 234. According to the driving voltage VD received by the output stage circuit 220, the constant-gm switch circuit 232 allows the current mirror circuit 234 to operate during a transition period when the driving voltage VD is transited, so as to provide a compensation current ICOMP for the input stage circuit 210. When the driving voltage VD is in a non-transition period, the current mirror switch circuit 236 turns off the current mirror circuit 234.

Figure 3A:
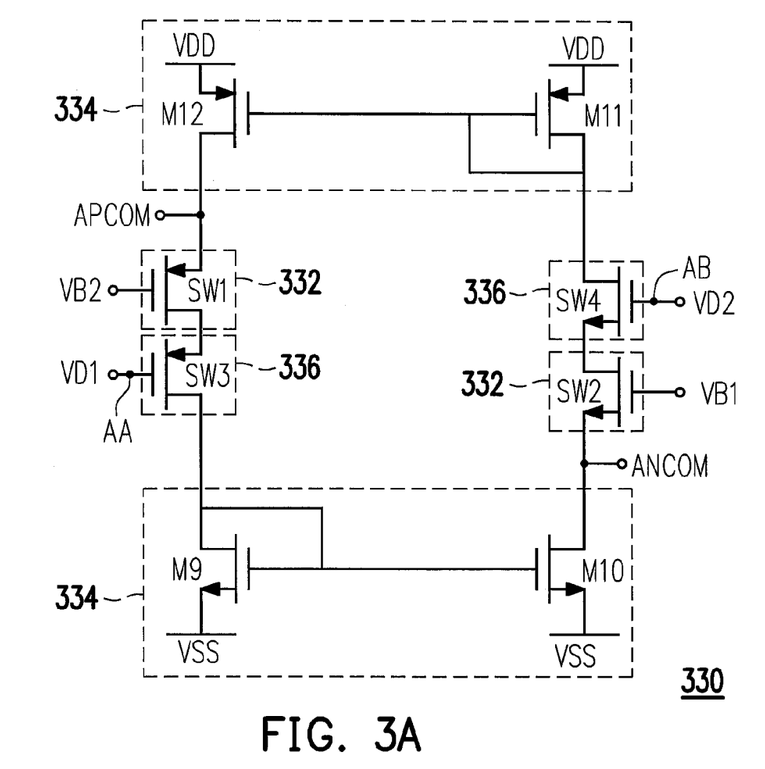
FIG. 3A is a circuit schematic diagram of a constant-gm circuit according to an embodiment of the invention.
Figure 3B:
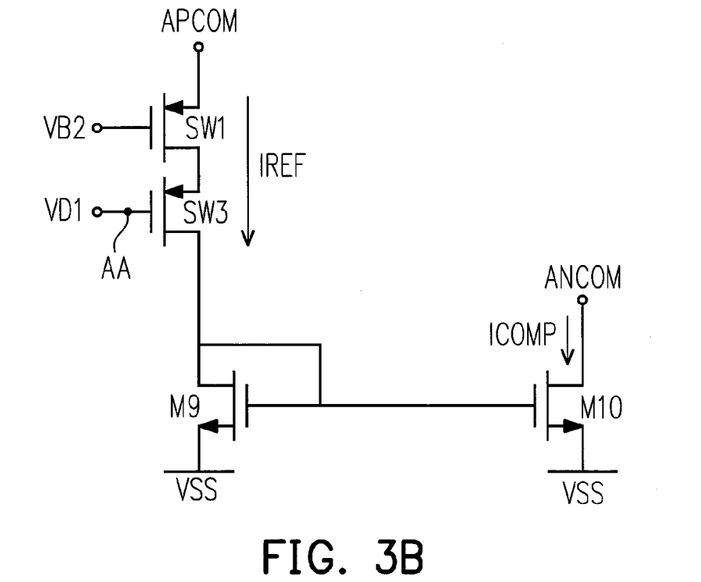
FIG. 3B is a circuit schematic diagram of a constant-gm circuit according to an embodiment of the invention.
Figure 4:
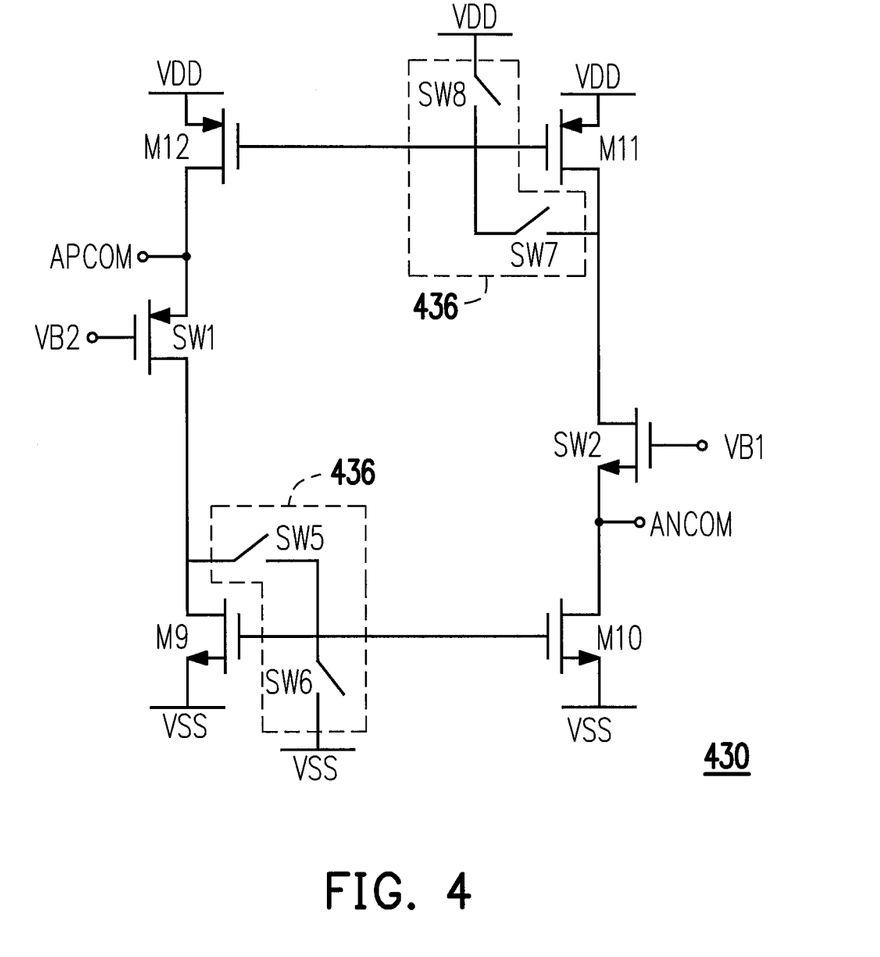
FIG. 4 is a circuit schematic diagram of a constant-gm circuit according to an embodiment of the invention.

FIG. 3A and FIG. 4 are detailed circuit schematic diagrams of the constant-gm circuit according to an embodiment of the invention. The transition current compensation mechanism implemented through constant-gm circuits 330 and 430 is introduced below with reference of various components illustrated in FIG. 1B.

The embodiment of FIG. 3A is first introduced. In the constant-gm circuit 330, the current mirror circuit 334 includes a first current mirror circuit (including a first reference transistor M9 and a first mapping transistor M10, for example, NMOS transistors) and a second current mirror circuit (including a second reference transistor M11 and a second mapping transistor M12, for example, PMOS transistors), where drains of the first and second reference transistors M9 and M11 are respectively connected to control terminals thereof for respectively providing reference currents in the first current mirror circuit and the second current mirror circuit. Moreover, the first and second mapping transistors M10 and M12 are respectively used for providing mapping currents in the first current mirror circuit and the second current mirror circuit.

The constant-gm switch circuit 332 includes a first switch SW1 and a second switch SW2. A first terminal of the first switch SW1 is coupled to the second common node APCOM and the second current mirror circuit composed of the transistors M11 and M12, and a control terminal of the first switch SW1 receives the second bias VB2. A first terminal of the second switch SW2 is coupled to the first common node ANCOM and the first current mirror circuit composed of the transistors M9 and M10, and a control terminal of the second switch SW2 receives the first bias VB1. The first switch SW1 is, for example, a PMOS transistor, and the second switch SW2 is, for example, an NMOS transistor.

The current mirror switch circuit 336 includes a third switch SW3 and a fourth switch SW4. A first terminal of the third switch SW3 is coupled to a second terminal of the first switch SW1, a second terminal of the third switch SW3 is coupled to the first current mirror circuit, and a control terminal of the third switch SW3 is coupled to the first input terminal AA of the output stage circuit 220 for receiving the driving voltage VD1. A first terminal of the fourth switch SW4 is coupled to the second terminal of the second switch S2, a second terminal of the fourth switch SW4 is coupled to the transistor M11 of the second current mirror circuit, and a control terminal of the fourth switch SW4 is coupled to the second input terminal AB of the output stage circuit 220 for receiving the driving voltage VD2. The third switch SW3 is, for example, a PMOS transistor, and the fourth switch SW4 is, for example, an NMOS transistor.

Operation status of transition current compensation of the constant-gm circuit 330 is described below. As described above, when the input voltage AVP is changed from the low voltage level to the high voltage level, and during the transition period of the operational amplifier 200, the driving voltage VD1 (corresponding to the first input terminal AA of the output stage circuit 220) is discharged to the low voltage level, and the output voltage AVO is charged to the high voltage level. Since the input voltage AVP and the output voltage AVO all have the high voltage level, the transistors M3 and M4 in the second transistor differential pair are turned off, such that the second common node APCOM is charged to the high voltage level by the power voltage VDD through the transistor M8 (which is turned on by suitably designing the second bias VB2) in case of no discharge path.

It should be noticed that the second common node APCOM of the high voltage level results in a fact that the mapping transistor M12 of the second current mirror circuit cannot provide a mapping current, such that the second common node APCOM is equivalent to turn off the second current mirror circuit. Therefore, the constant-gm circuit 330 is as that shown in FIG. 3B. In this way, during the transition period of the operational amplifier 200, the low voltage level of the driving voltage VD1 turns on the third switch SW3, and when the high voltage level of the second common node APCOM also turns on the first switch SW1, through the current path formed by the first switch SW1 and the third switch SW3, the first reference transistor M9 of the first current mirror circuit can drain a reference current IREF from the second common node APCOM, and the mapping transistor M10 provides the mapped compensation current ICOMP to the first common node ANCOM to complete the transition current compensation.

Similarly, when the input voltage AVP is changed from the high voltage level to the low voltage level, the mapping transistor M12 of the second current mirror circuit of the constant-gm circuit 330 provides the compensation current ICOMP to the second common node APCOM through the current path formed by the second switch SW2 and the fourth switch SW4.

In this way, during the transition period of the operational amplifier 200, and when one of the first transistor differential pair and the second transistor differential pair is turned off in response to transition of the driving voltages VD1 and VD2, the constant-gm switch circuit 332 can provide the compensation current to another one of the first transistor differential pair and the second transistor differential pair during the transition period according to the driving voltages VD1 and VD2 received by the output stage circuit 220. It should be noticed that since the driving voltages VD1 and VD2 only change during the transition period, the constant-gm circuit 330 can only turn on one of the third switch SW3 and the fourth switch SW4 of the current mirror switch circuit 336 during the transition period of the operational amplifier to provide the compensation current ICOMP to the input stage circuit 210, so as to improve the response speed of the operational amplifier 200. Under a non-transition state (i.e. a stable state), the third switch SW3 and the fourth switch SW4 are all turned off, such that the current source circuit is turned off without providing the current compensation, so as to decrease the DC power consumption of the operational amplifier 200 in the stable state.

It should be noticed that regarding the first switch SW1 of the constant-gm switch circuit 332, only after the transistors M3 and M4 of the second transistor differential pair are turned off, the second common node APCOM can be charged to the high voltage level by the power voltage VDD (i.e., a voltage difference between the second common node APCOM of the high voltage level and the second bias VB2 satisfies a conduction voltage of the first switch SW1) to turn on the first switch SW1. In other words, the first switch SW1 ensures that the transition current compensation is performed only after the transistors M3 and M4 of the second transistor differential pair are turned off. Similarly, the second switch SW2 ensures that the transition current compensation is performed only after the transistors M1 and M2 of the first transistor differential pair are turned off.

FIG. 4 is a circuit schematic diagram of a constant-gm circuit 430 according to another embodiment of the invention. Different to the embodiment of FIG. 3, a current mirror switch circuit 436 of the constant-gm circuit 430 includes a fifth switch SW5, a sixth switch W6, a seventh switch SW7 and an eighth switch SW8. A first terminal of a first reference transistor M9 of the first current mirror circuit and a control terminal of the first reference transistor M9 are connected through the fifth switch SW5, and are commonly connected to the second terminal of the first switch SW1, and the control terminal of the first reference transistor M9 is coupled to the ground voltage VSS through the sixth switch SW6. Moreover, a first terminal of a second reference transistor M11 of the second current mirror circuit and a control terminal of the second reference transistor M11 are connected through the seventh switch SW7, and are commonly connected to the second terminal of the second switch SW2, and the control terminal of the second reference transistor M11 is coupled to the power voltage VDD through the eighth switch SW8.

Therefore, regarding the operation of the constant-gm circuit 430, the fifth switch SW5 is turned on or turned off according to a voltage level (corresponding to the driving voltage VD1) of the first input terminal AA of the output stage circuit 220, and the sixth switch SW6 is turned on or turned off according to a voltage level inverted to the voltage level of the first input terminal AA of the output stage circuit 220. In detail, when the input voltage AVP is changed from the low voltage level to the high voltage level, and during the transition period of the operational amplifier 200, the first input terminal AA (corresponding to the driving voltage VD1) is the low voltage level, such that the fifth switch SW5 is turned on, and the sixth switch SW6 is turned off. Therefore, during the transition period of the operational amplifier 200, the first current mirror circuit can immediately provide the compensation current to the first common node ANCOM, so as to enhance the response speed of the operational amplifier 200. Comparatively, during the non-transition period (i.e. the stable state) of the operational amplifier 200, the fifth switch SW5 is turned off and the sixth switch SW6 is turned on, so as to turn off the current source circuit without providing the current compensation.

Similarly, the seventh switch SW7 is turned on or turned off according to a voltage level (corresponding to the driving voltage VD2) of the second input terminal AB of the output stage circuit 220, and the eighth switch SW8 is turned on or turned off according to a voltage level inverted to the voltage level of the second input terminal AB of the output stage circuit 220. In this way, when the input voltage AVP is changed from the high voltage level to the low voltage level, and during the transition period of the operational amplifier 200, the second input terminal AB (corresponding to the driving voltage VD2) is the high voltage level, such that the seventh switch SW7 is turned on, and the eighth switch SW8 is turned off. Therefore, the second current mirror circuit can provide the compensation current to the second common node APCOM.

In this way, in the present embodiment, the switches SW5-SW8 are used to determine a circuit structure, so as to control the operation of the current mirror, and implement the current compensation during the transition period.

In summary, the operational amplifier and the driving circuit thereof provided by the invention can determine whether the operational amplifier has a transition according to the driving voltages provided by the input stage circuit, and determine whether the current path is turned on by controlling the switches through the driving voltages, or determine a structure of the current mirror circuit through the switches, so as to control the operation of the current mirror circuit and dynamically provide the compensation current to the input stage circuit only during the transition period. In this way, the invention implements a transition current compensation mechanism, by which a response speed of the operational amplifier is effectively enhanced and extra DC power consumption under the stable state is mitigated.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An operational amplifier, comprising:
    an input stage circuit, providing at least one driving voltage according to an input voltage;
    an output stage circuit, coupled to the input stage circuit, and having at least one input terminal and an output terminal, wherein the at least one input terminal receives the at least one driving voltage, and the output terminal provides an output voltage according to the at least one driving voltage, and the output terminal is coupled to an inverted input terminal of the input stage circuit; and
    a constant-gm circuit, comprising:
        a constant-gm switch circuit, coupled to the input stage circuit, and controlling an operation of the constant-gm circuit;
        at least one current mirror circuit, coupled to the constant-gm switch circuit; and
        a current mirror switch circuit, coupled between the constant-gm switch circuit and the at least one current mirror circuit, wherein the constant-gm switch circuit allows the at least one current mirror circuit to operate during a transition period when the at least one driving voltage is transited according to the at least one driving voltage received by the output stage circuit, so as to provide a compensation current for the input stage circuit,
    wherein when the at least one driving voltage is in a non-transition period, the current mirror switch circuit turns off the at least one current mirror circuit.

2. The operational amplifier as claimed in claim 1, wherein the at least one driving voltage is transited along with transition of the input voltage.

3. The operational amplifier as claimed in claim 1, wherein the at least one input terminal of the output stage circuit comprises a first input terminal and a second input terminal, and the input stage circuit comprises:
    a first transistor differential pair, comprising:
        a first transistor, having a first terminal, a second terminal and a control terminal, wherein the first terminal of the first transistor is coupled to the first input terminal of the output stage circuit, and the control terminal of the first transistor receives the input voltage; and
        a second transistor, has a first terminal, a second terminal and a control terminal, wherein the control terminal of the second transistor receives the output voltage,
        wherein the second terminal of the first transistor and the second terminal of the second transistor are commonly coupled to a first common node, and a voltage level of the first common node is determined by a first bias; and
    a second transistor differential pair, comprising:
        a third transistor, having a first terminal, a second terminal and a control terminal, wherein the first terminal of the third transistor is coupled to the second input terminal of the output stage circuit, and the control terminal of the third transistor receives the input voltage; and
        a fourth transistor, having a first terminal, a second terminal and a control terminal, wherein the control terminal of the fourth transistor receives the output voltage,
        wherein the second terminal of the third transistor and the second terminal of the fourth transistor are commonly coupled to a second common node, and a voltage level of the second common node is determined by a second bias.

4. The operational amplifier as claimed in claim 3, wherein when one of the first transistor differential pair and the second transistor differential pair is turned off in response to transition of the at least one driving voltage, the constant-gm switch circuit provides the compensation current to another one of the first transistor differential pair and the second transistor differential pair during the transition period according to the at least one driving voltage received by the output stage circuit.

5. The operational amplifier as claimed in claim 3, wherein the output stage circuit comprises:
 a fifth transistor, having a first terminal, a second terminal and a control terminal, wherein the first terminal of the fifth transistor is coupled to a power voltage, the second terminal of the fifth transistor is coupled to the output terminal, and the control terminal of the fifth transistor serves as the first input terminal of the output stage circuit and receives the at least one driving voltage; and
 a sixth transistor, having a first terminal, a second terminal and a control terminal, wherein the first terminal of the sixth transistor is coupled to a ground voltage, the second terminal of the sixth transistor is coupled to the output terminal, and the control terminal of the sixth transistor serves as the second input terminal of the output stage circuit and receives the at least one driving voltage.

6. The operational amplifier as claimed in claim 3, wherein the input stage circuit comprises:
 a seventh transistor, having a first terminal, a second terminal and a control terminal, wherein the first terminal and the second terminal of the seventh transistor are coupled between the first common node and a ground voltage, and the control terminal of the seventh transistor receives the first bias; and
 an eighth transistor, having a first terminal, a second terminal and a control terminal, wherein the first terminal and the second terminal of the eighth transistor are coupled between the second common node and a power voltage, and the control terminal of the eighth transistor receives the second bias.

7. The operational amplifier as claimed in claim 3, wherein the at least one current mirror circuit comprises a first current mirror circuit and a second current mirror circuit, and the constant-gm switch circuit comprises:
 a first switch, having a first terminal, a second terminal and a control terminal, wherein the first terminal of the first switch is coupled to the second common node and the second current mirror circuit, and the control terminal of the first switch receives the second bias; and
 a second switch, having a first terminal, a second terminal and a control terminal, wherein the first terminal of the second switch is coupled to the first common node and the first current mirror circuit, and the control terminal of the second switch receives the first bias.

8. The operational amplifier as claimed in claim 7, wherein the current mirror switch circuit comprises:
 a third switch, having a first terminal, a second terminal and a control terminal, wherein the first terminal of the third switch is coupled to the second terminal of the first switch, the second terminal of the third switch is coupled to the first current mirror circuit, and the control terminal of the third switch is coupled to the first input terminal of the output stage circuit; and
 a fourth switch, having a first terminal, a second terminal and a control terminal, wherein the first terminal of the fourth switch is coupled to the second terminal of the second switch, the second terminal of the fourth switch is coupled to the second current mirror circuit, and the control terminal of the fourth switch is coupled to the second input terminal of the output stage circuit.

9. The operational amplifier as claimed in claim 7, wherein the current mirror switch circuit comprises a fifth switch, a sixth switch, a seventh switch and an eighth switch, the first current mirror circuit comprises a first reference transistor, and the second current mirror circuit comprises a second reference transistor, wherein
 the first reference transistor has a first terminal, a second terminal and a control terminal, the first terminal of the first reference transistor and the control terminal of the first reference transistor are connected through the fifth switch, and are commonly connected to the second terminal of the first switch, and the control terminal of the first reference transistor is coupled to the ground voltage through the sixth switch, wherein
  the fifth switch is turned on or turned off according to a voltage level of the first input terminal of the output stage circuit,
  the sixth switch is turned on or turned off according to a voltage level inverted to the voltage level of the first input terminal of the output stage circuit; and
 the second reference transistor has a first terminal, a second terminal and a control terminal, the first terminal of the second reference transistor and the control terminal of the second reference transistor are connected through the seventh switch, and are commonly connected to the second terminal of the second switch, and the control terminal of the second reference transistor is coupled to a power voltage through the eighth switch, wherein
  the seventh switch is turned on or turned off according to a voltage level of the second input terminal of the output stage circuit, and
  the eighth switch is turned on or turned off according to a voltage level inverted to the voltage level of the second input terminal of the output stage circuit.

10. The operational amplifier as claimed in claim 3, wherein the input stage circuit further comprises:
 a third current mirror, coupled between the first terminal of the first transistor and the first terminal of the second transistor in the first transistor differential pair and a power voltage;
 a fourth current mirror, coupled between the first terminal of the third transistor and the first terminal of the fourth transistor in the second transistor differential pair and a ground voltage; and
 a fifth current mirror, coupled between the first terminal of the first transistor and the first terminal of the second transistor in the first transistor differential pair and the first terminal of the third transistor and the first terminal of the fourth transistor in the second transistor differential pair.

11. The operational amplifier as claimed in claim 10, wherein the output stage circuit comprises:
 a compensation capacitor circuit, coupled between the third current mirror and the fifth current mirror for stabilizing the output voltage.

12. The operational amplifier as claimed in claim 3, wherein the operational amplifier is a rail-to-rail operational amplifier, the first transistor differential pair is an N-type transistor differential pair, and the second transistor differential pair is a P-type transistor differential pair.

13. A driving circuit of an operational amplifier, wherein the operational amplifier comprises an input stage circuit and an output stage circuit, and the output stage circuit receives at least one driving voltage, the driving circuit comprising:
- a constant-gm switch circuit, coupled to the input stage circuit, and controlling an operation of the driving circuit;
- at least one current mirror circuit, coupled to the constant-gm switch circuit; and
- a current mirror switch circuit, coupled between the constant-gm switch circuit and the current mirror circuit, wherein the constant-gm switch circuit allows the at least one current mirror circuit to operate during a transition period when the at least one driving voltage is transited according to the at least one driving voltage received by the output stage circuit, so as to provide a compensation current for the input stage circuit,
- wherein when the driving voltage is in a non-transition period, the current mirror switch circuit turns off the at least one current mirror circuit.

* * * * *